(12) United States Patent
Hedler et al.

(10) Patent No.: US 6,756,540 B2
(45) Date of Patent: Jun. 29, 2004

(54) SELF-ADHERING CHIP

(75) Inventors: Harry Hedler, Germering (DE); Barbara Vasquez, Munich (DE)

(73) Assignee: Infineon Technologies AG, Münich (DE)

( * ) Notice: Subject to any disclaimer, the term of this patent is extended or adjusted under 35 U.S.C. 154(b) by 14 days.

(21) Appl. No.: 10/155,337

(22) Filed: May 24, 2002

(65) Prior Publication Data
US 2003/0035276 A1 Feb. 20, 2003

(30) Foreign Application Priority Data
May 28, 2001 (DE) .......................................... 101 25 905

(51) Int. Cl.⁷ ................................................. H01R 9/09
(52) U.S. Cl. ........................... 174/52.4; 439/66; 439/74
(58) Field of Search .......................... 174/52.4; 439/66, 439/68, 72, 75, 74; 29/832, 842, 844, 845; 361/760

(56) References Cited

U.S. PATENT DOCUMENTS

| 5,312,456 A | * | 5/1994 | Reed et al. ................. 411/456 |
| 5,411,400 A | * | 5/1995 | Subrahmanyan et al. ..... 439/68 |
| 5,557,504 A | | 9/1996 | Siegel et al. |
| 5,724,728 A | | 3/1998 | Bond et al. |
| 6,332,267 B1 | * | 12/2001 | Davis et al. ................... 29/830 |
| 6,392,144 B1 | * | 5/2002 | Filter et al. ................ 174/52.4 |

FOREIGN PATENT DOCUMENTS

| DE | 196 36 112 | 5/1996 |
| DE | 198 14 164 | 3/1998 |
| EP | 0 843 352 | 5/1998 |
| WO | WO00/54321 | 9/2000 |

OTHER PUBLICATIONS

Patent Abstracts of Japan—10074778 A Aug. 29, 1996—NEC Kyushu Ltd.

* cited by examiner

Primary Examiner—Anthony Dinkins
Assistant Examiner—Carmelo Oliva
(74) Attorney, Agent, or Firm—Schiff Hardin LLP

(57) ABSTRACT

An integrated circuit (chip) with attachment elements for attaching of the chip on a carrier, the attachment elements being designed in a way such that they can enter into a releasable connection with corresponding attachment elements formed on the carrier. To keep the package size of the chips as small as possible, the attachment elements are arranged directly on the unpackaged chip.

19 Claims, 15 Drawing Sheets

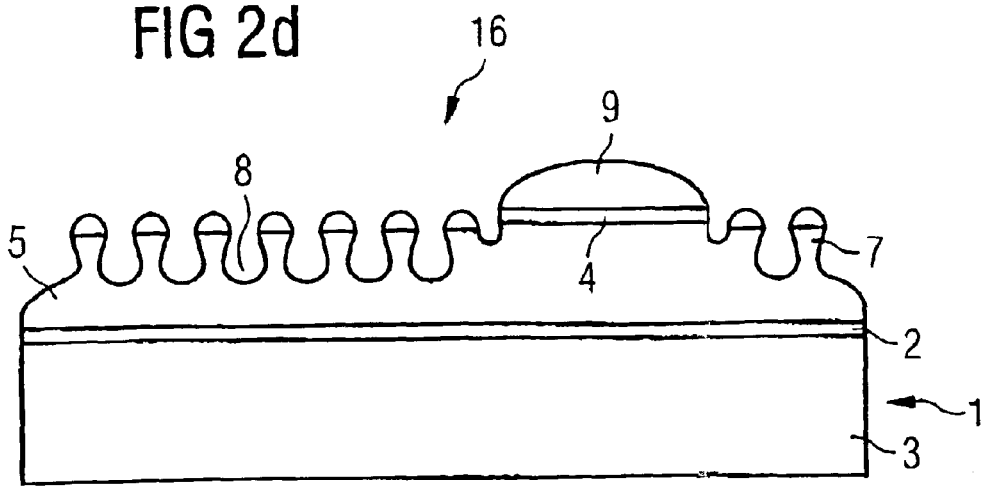
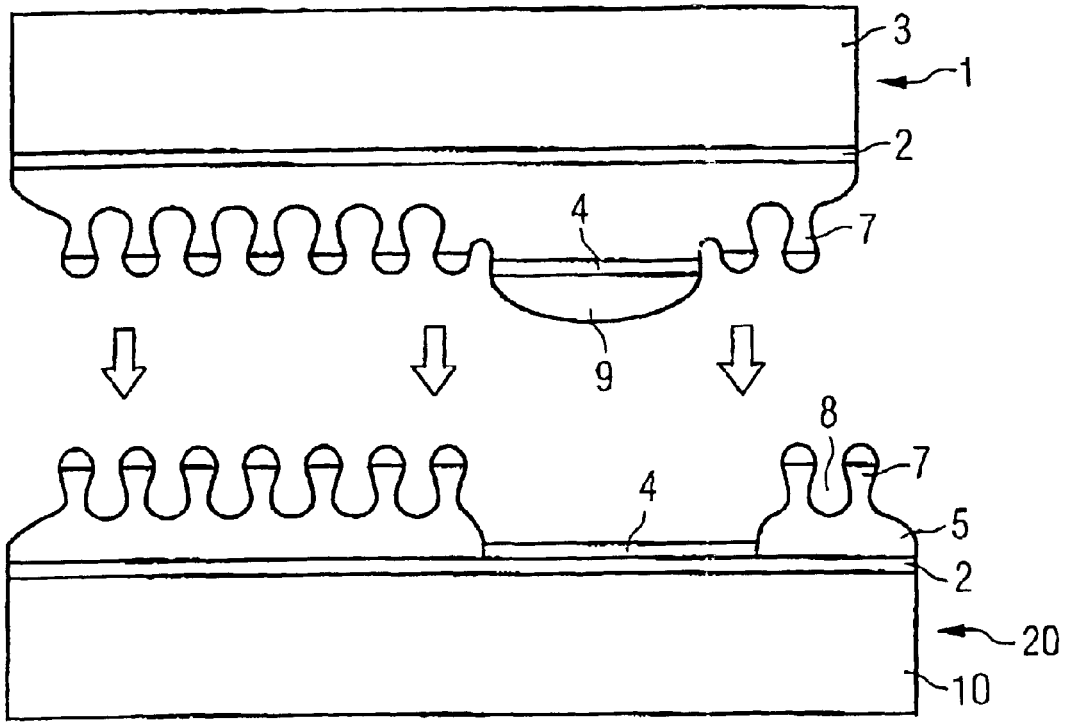

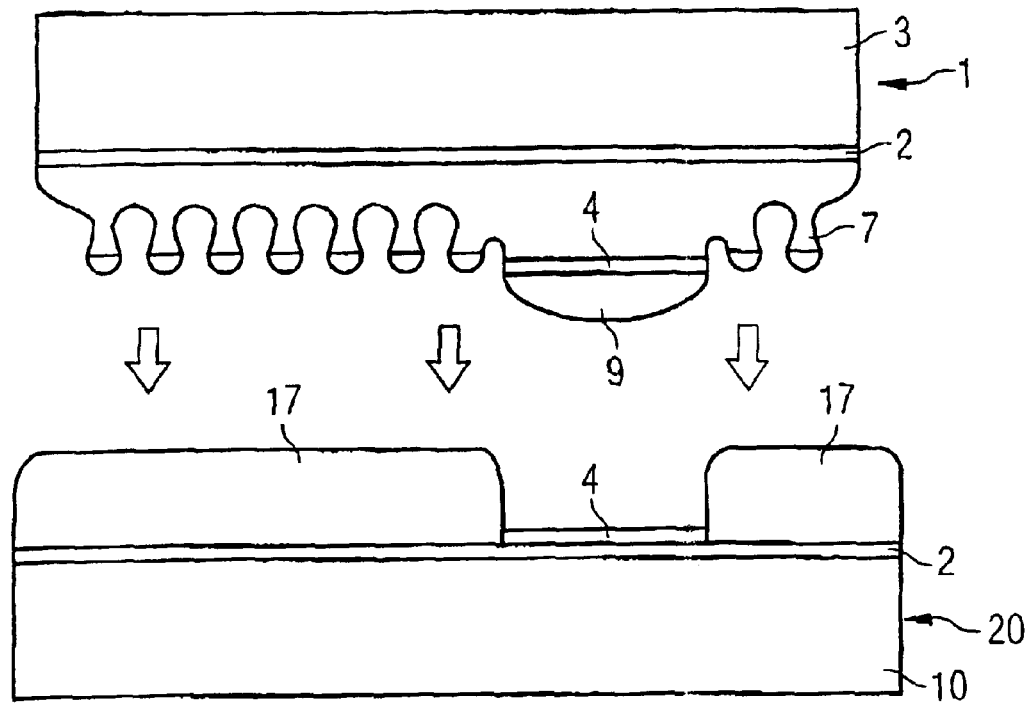
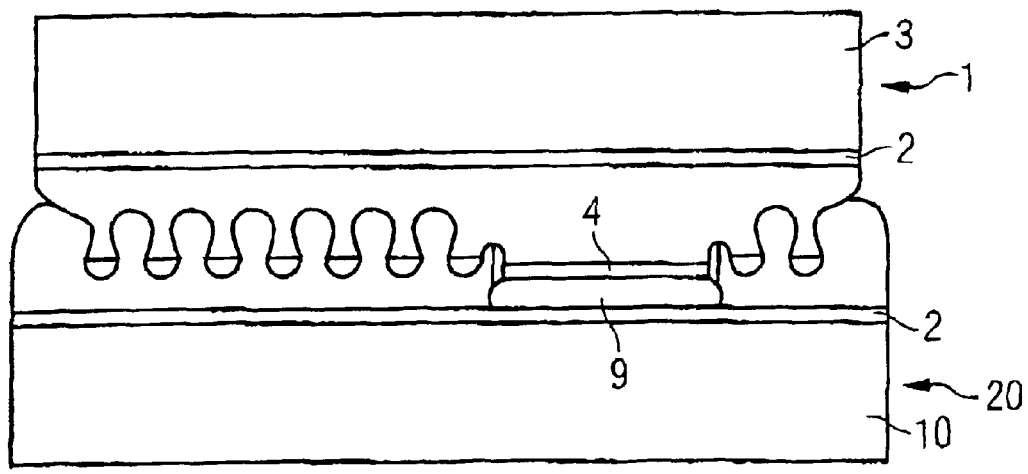

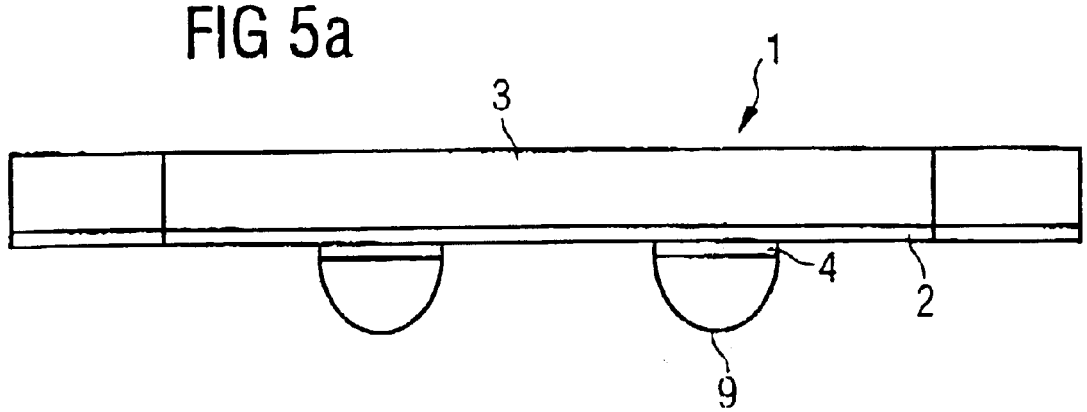
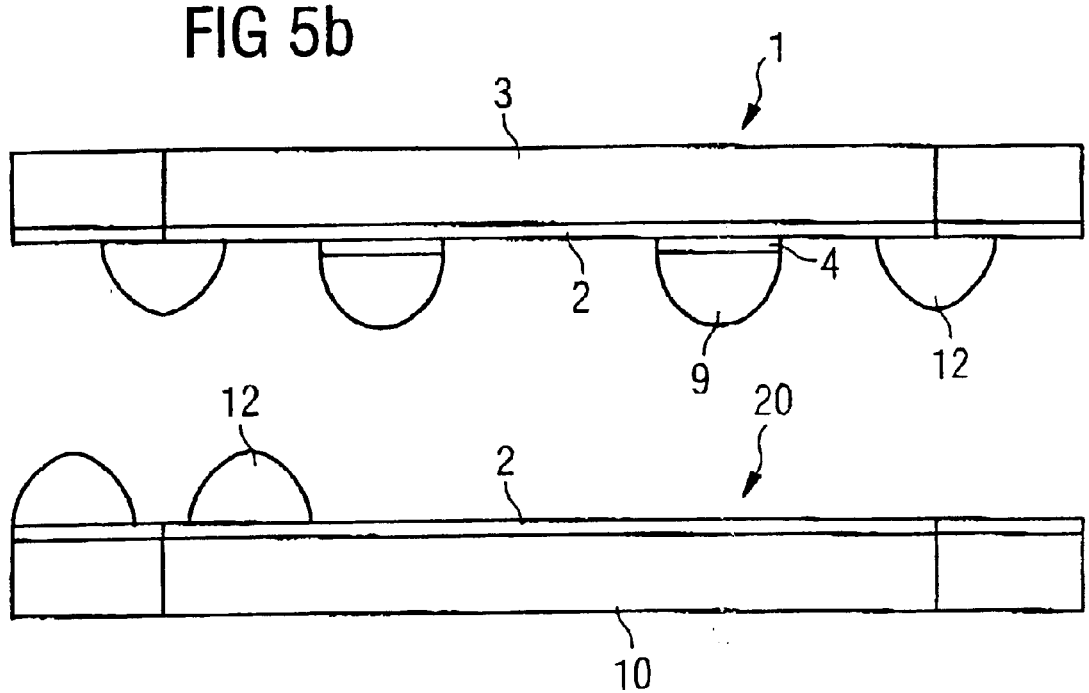

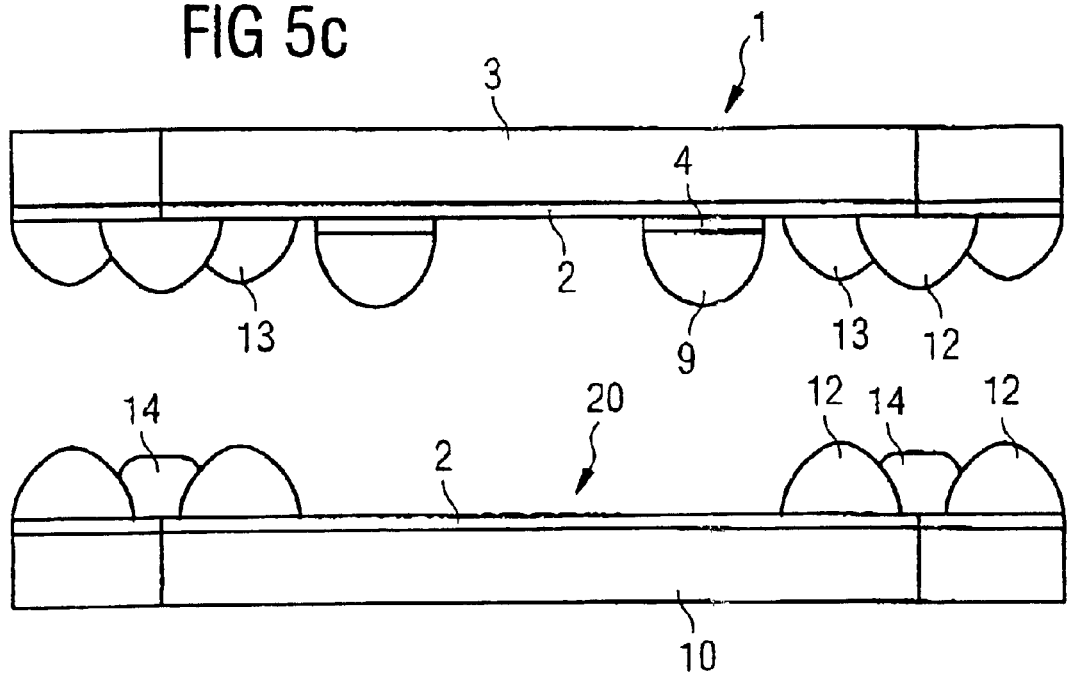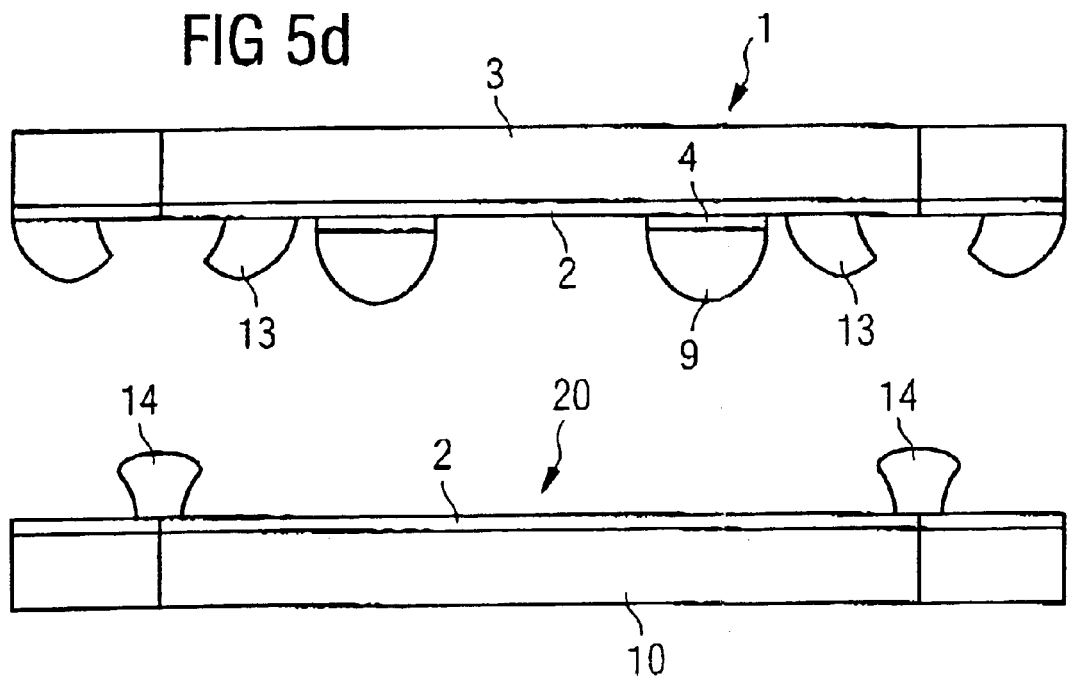

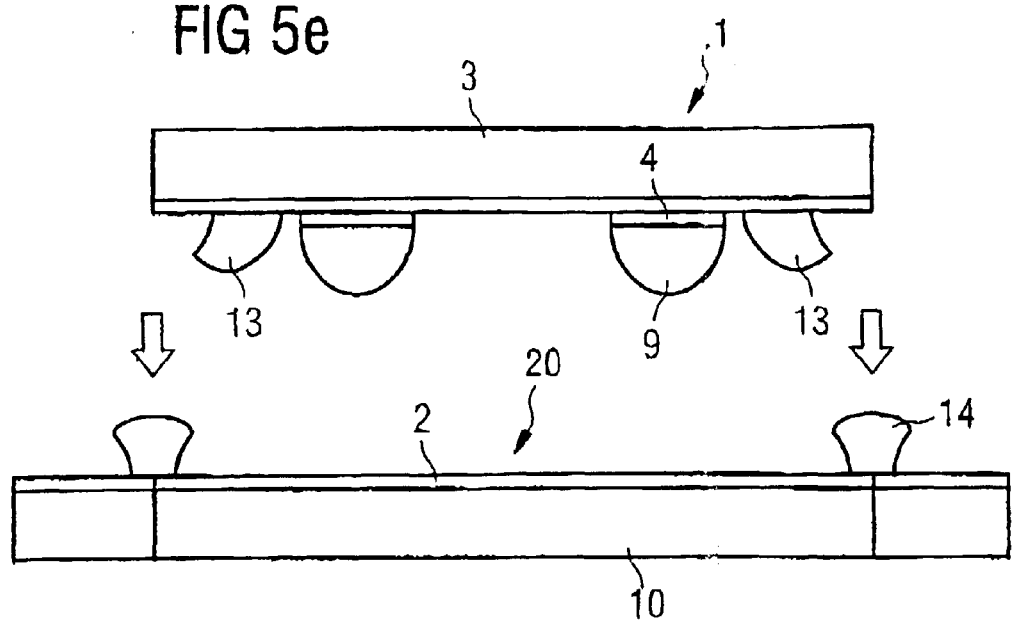
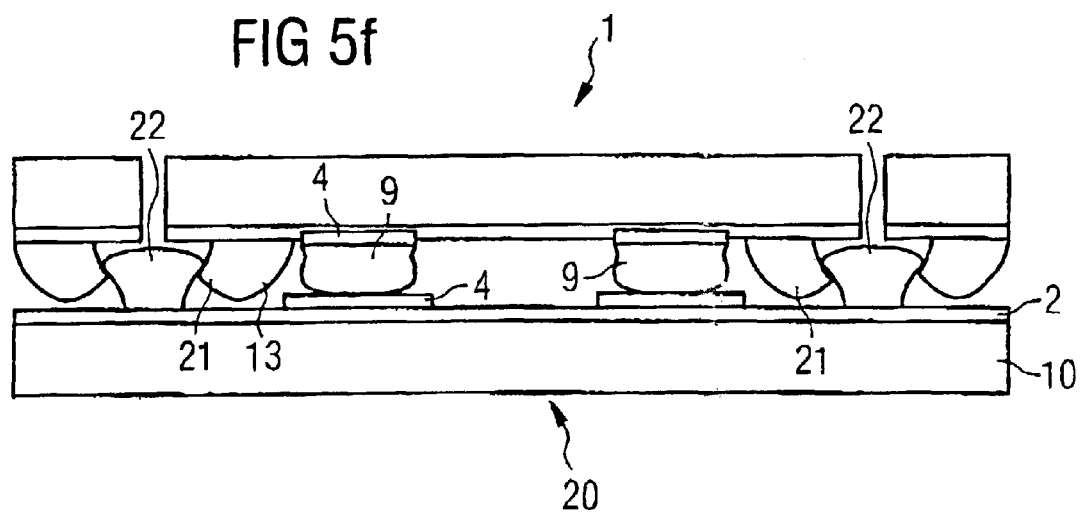

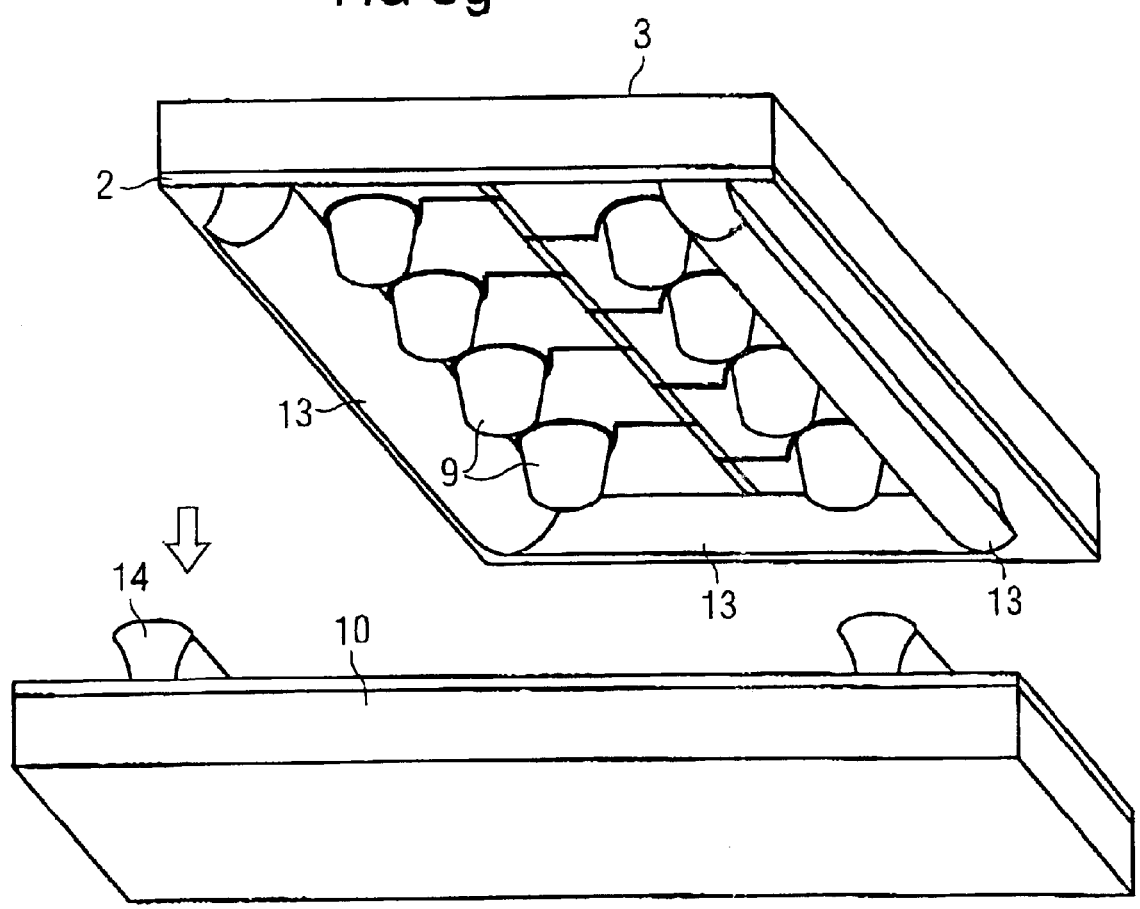

SELF-ADHERING CHIP

BACKGROUND OF THE INVENTION

The invention relates to an integrated circuit (chip).

Chips are usually securely soldered on printed circuit boards or attached on a carrier in some other way. For various reasons, however, it is desired to mount the chip on the carrier reversibly, i.e. such that it can be detached without being destroyed. Such technology is of advantage, for example, for carrying out chip tests and also makes it much easier to exchange defective chips.

Checking the functionality of chips generally takes place by means of special testers. In a conventional chip test for packaged chips, such as for example TSOP chips (TSOP: Thin Small Outline Package) or BGA chips (BGA: Ball Grid Array), the chips are inserted into test sockets which have complicated mechanical constructions and must perform mechanical compensating movements to connect the chip contacts, usually formed as soldered contacts, to the test board. The mechanical complexity of test sockets of this type is therefore relatively great and the type of connection is complicated. With increasing integration and pattern spacings becoming ever smaller, such mechanical contacting is becoming more and more difficult. This applies in particular to more recent generations of unpackaged chips, such as for example CSP chips (CSP: Chip Size Package)

The exchange of defective chips of multichip modules (MCM) has until now been performed by unsoldering the defective part, and cleaning and soldering in a good part. This known exchanging process is not only costly and time-consuming, it also cannot be automated very well.

In the case of packaged chips with legs (Lead Frame Based Packages), the exchange of the chips can also be performed with the aid of a socket which is soldered onto the carrier. However, the contacts of chips of a more recent generation are differently designed (as small balls), making this solution obsolete.

SUMMARY OF THE INVENTION

It is an object of the present invention to provide a technology for mounting chips on printed circuit boards or other carriers with which the chip can be attached on the carrier in such a way that it can be exchanged without being damaged.

According to the invention, for an integrated circuit chip, attachment elements are provided for attaching the chip on a carrier. The attachment elements of the chip are designed such that they can enter into a releasable connection with corresponding attachment elements formed on the carrier. The attachment elements are arranged on the unpackaged chip.

BRIEF DESCRIPTION OF THE DRAWINGS

FIGS. 2a–f shows a number of method steps in the production of a self-adhering chip arrangement according to a second embodiment;

FIGS. 4a, b shows method steps in the production of a self-adhering chip arrangement using a plastically deformable fluid;

FIGS. 5a–g shows various method steps in the production of a self-adhering chip arrangement according to a third embodiment;

DESCRIPTION OF THE PREFERRED EMBODIMENTS

Figure 1A:
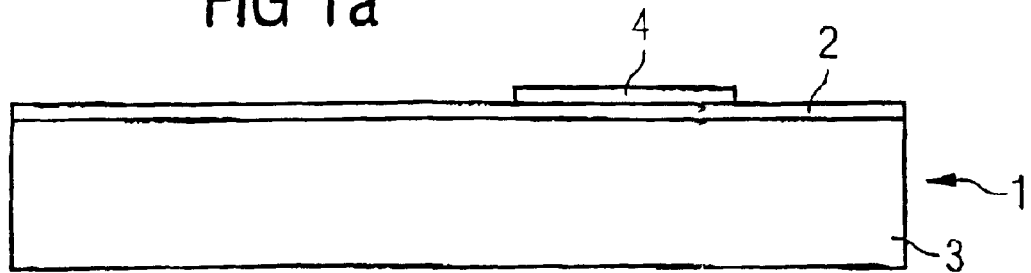
FIGS. 1a–h shows a number of method steps in the production of a self-adhering chip arrangement, comprising a chip and carrier.

For the purposes of promoting an understanding of the principles of the invention, reference will now be made to the preferred embodiments illustrated in the drawings and specific language will be used to describe the same. It will nevertheless be understood that no limitation of the scope of the invention is thereby intended, such alterations and further modifications in the illustrated device, and/or method, and such further applications of the principles of the invention as illustrated therein being contemplated as would normally occur now or in the future to one skilled in the art to which the invention relates.

A chip and carrier are provided with attachment elements which engage releasably in one another. In this case, the attachment elements of the chip are arranged directly on the "bare", i.e. unpackaged, chip. It goes without saying that a package may be provided on the regions of the chip outside the attachment.

The term "carrier" is to be understood in this description as meaning any type of element, such as for example printed circuit boards, sockets, other chips etc., on which the chip can be detachably attached.

The attachment elements of the chip and also those of the carrier are preferably produced from a layer, in particular a polymer layer, arranged on the chip or carrier.

The releasable connection is preferably formed on the basis of the lock-and-key principle, the oppositely lying attachment elements of the chip and carrier engaging in one another, with a slight pressure being exerted, locking in one another and consequently holding one securely in place on the other. If, in the reverse direction, a corresponding pull is exerted, the two mating parts can be separated from one another without being destroyed. This can also be performed repeatedly.

Preferably, at least the attachment elements of the chip or of the carrier are elastically formed.

The chip can consequently be inserted into a corresponding test board to carry out a chip test. After the successful test, the chip can be placed on the module board. After the corresponding module test, chips specified as defective can in turn be exchanged.

According to one embodiment, the opposing attachment elements of the chip and carrier are formed as a snap fastener.

According to one embodiment, the attachment elements of the chip comprise, for example, a number of extensions and depressions. Those of the carrier comprise corresponding mating pieces.

According to one embodiment, certain portions, in particular edges, of the chip itself may also serve as attachment elements, which interact with corresponding attachment elements of the carrier.

The attachment elements of the chip or carrier may also have, for example, hook-like elements.

The attachment elements preferably serve exclusively for the mechanical connection of the chip and carrier and are, in particular, not electrically conducting.

For the electrical contacting of the chip and carrier, preferably contact means are provided. According to a special embodiment, the contact elements comprise elastic contact elements which preferably protrude outward beyond the attachment elements. After placement of the chip onto the carrier, these contact elements are then under mechanical compressive stress, whereby a reliable contact is ensured.

When viewed perpendicularly in relation to the surface of the chip or carrier, the contact elements should generally be longer than the distance between the surface of the chip and surface of the carrier in the assembled state.

The contact elements are preferably arranged on a contact pad.

FIG. 1a shows a chip 1, which is represented in a simplified way and essentially comprises a substrate 3 and an insulating layer 2, for example of polyamide, lying over the latter. Arranged on the chip 1 or the insulating layer 2 is a contact pad 4, which is in electrical contact with the substrate 3.

Figure 1B:
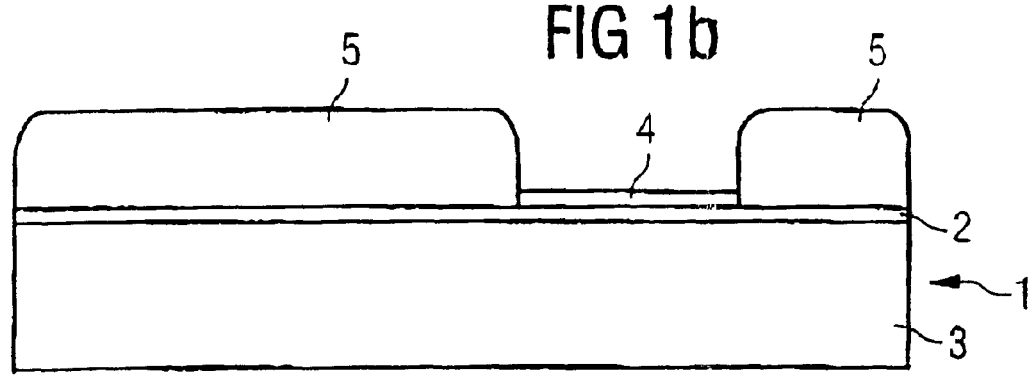

As shown in FIG. 1b, in a following process step, a layer 5, in particular a polymer layer, is applied to the arrangement and structured in the way represented. The application and structuring of the polymer layer 5 takes place for example by spin coating with subsequent lithography and application of a suitable printing technique.

Figure 1C:
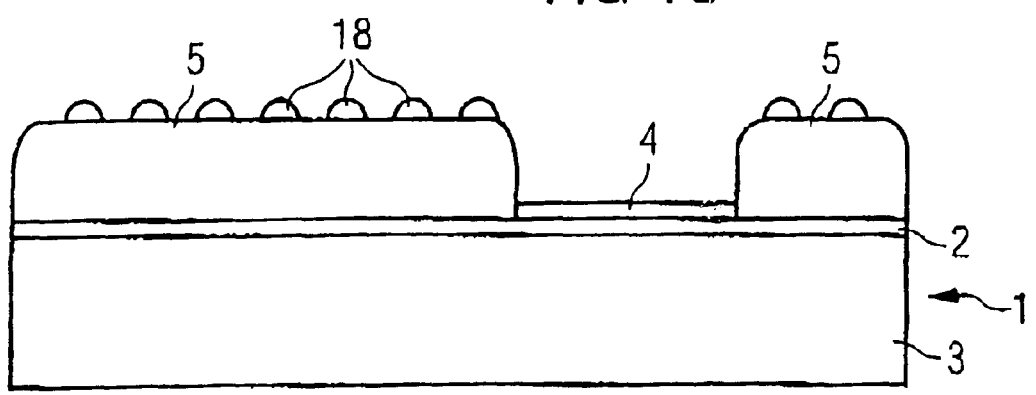

FIG. 1c shows the application of a number of relatively etching-resistant structure elements 18 to the polymer layer 5. The structure elements 18 comprise, for example, filled polymer which has a lower selective etching rate than the polymer layer 5.

Figure 1D:
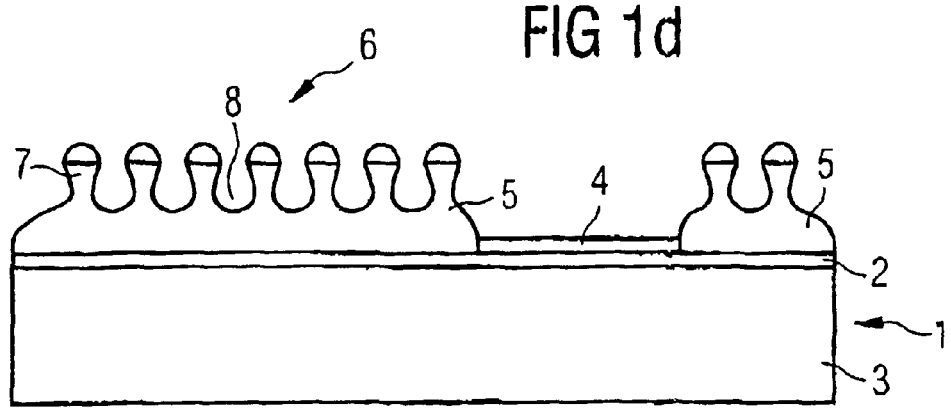

The state after etching is represented in FIG. 1d. The etching step can be carried out both as a dry process and as a wet process. The relief structure of the attachment elements 6 produced after the etching comprises a number of extensions 7 and depressions 8.

Figure 1E:
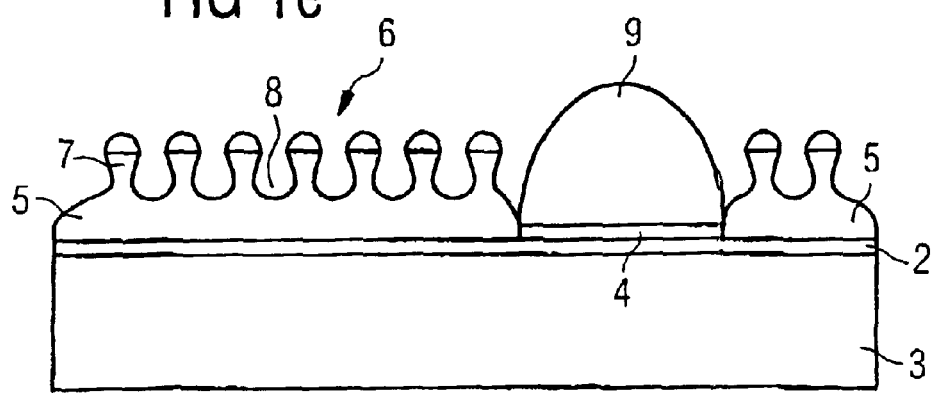

The application of a contact element 9 to the contact pad 4 is represented in FIG. 1e. The contact element 9 comprises, for example, a conductive polymer which has been produced by a suitable printing technique. The contact element 9 is arranged or designed in such a way that it protrudes outward beyond the attachment elements 6.

Figure 1F:
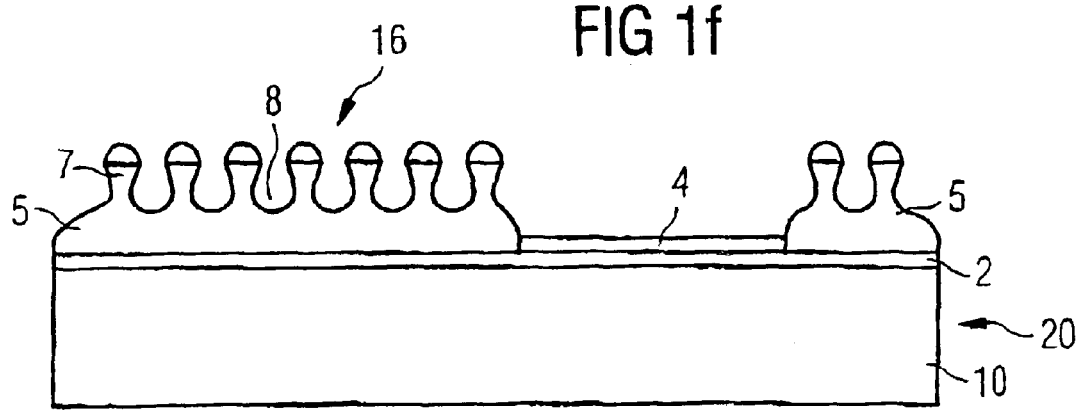

FIG. 1f shows an associated carrier 20 with corresponding "negative" attachment elements 16. The carrier 20 essentially comprises a printed circuit board 10 with an insulating layer 2 located on it. On the carrier 20 there are means of attachment 16 which correspond to the attachment elements 6 of the chip 1 and are formed in such a way that the chip 1 and carrier 20 can be releasably connected to one another. These negative attachment elements 16 likewise comprise extensions 7 and depressions 8.

Figure 1G:
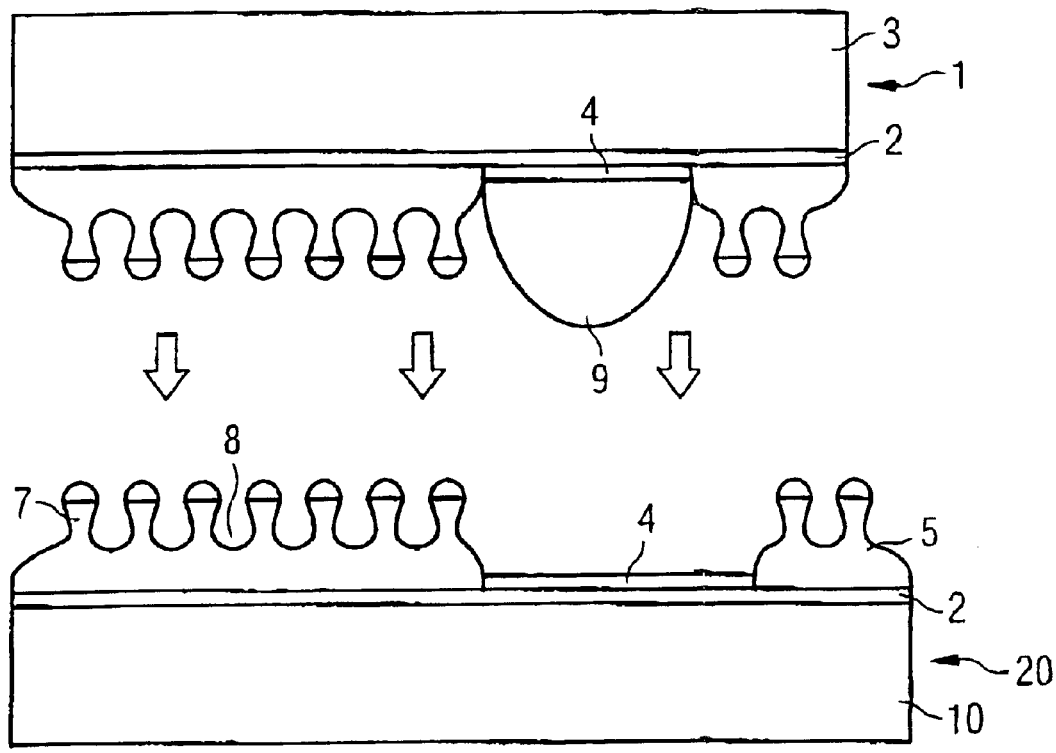

FIG. 1g shows the positioning and joining together of the chip 1 and the carrier 20. The joining together of the chip 1 and carrier 20 is performed with slight pressure being exerted, whereby the attachment elements 6, 16 engage in one another and lock in the position shown in FIG. 1h. At least one of the attachment elements 6, 16 is elastically formed.

Figure 1H:
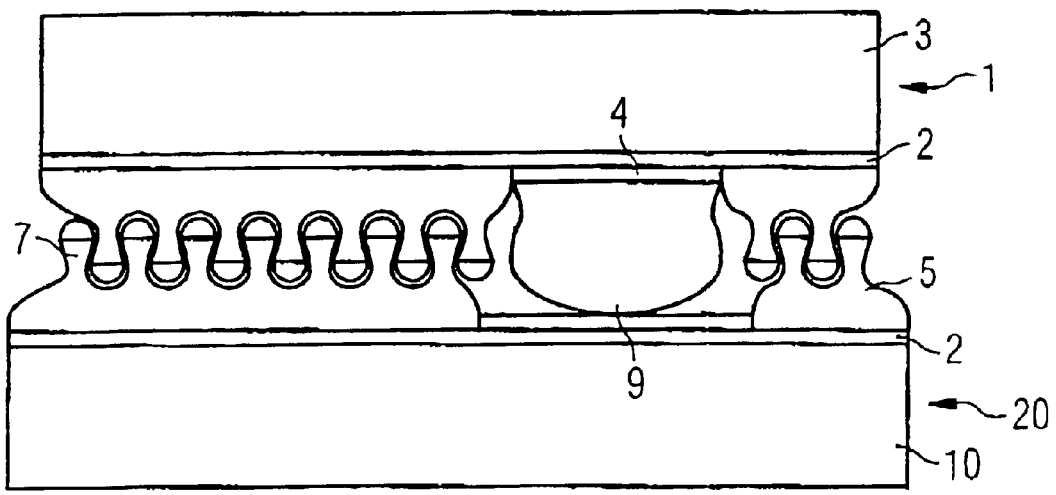

As can be seen in FIG. 1h, in the assembled state of the chip 1 and carrier 20, the contact element is elastically deformed and is, in particular, under compressive stress. As a result, a good electrical contact is ensured.

Figure 2A:
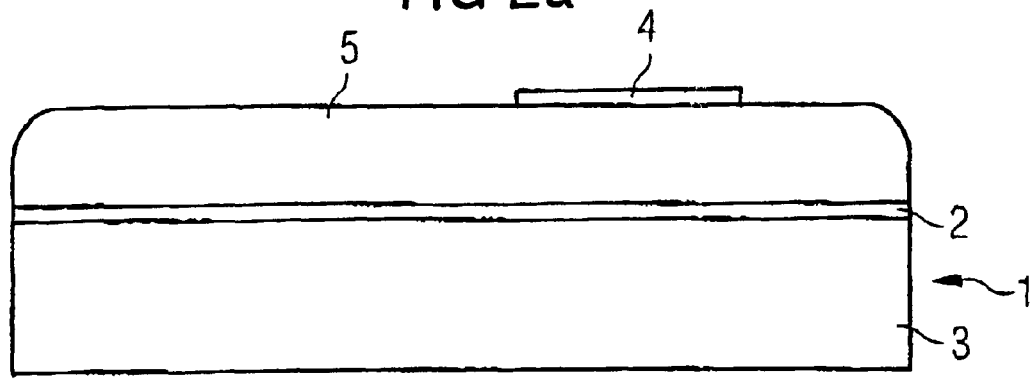
Figure 2B:
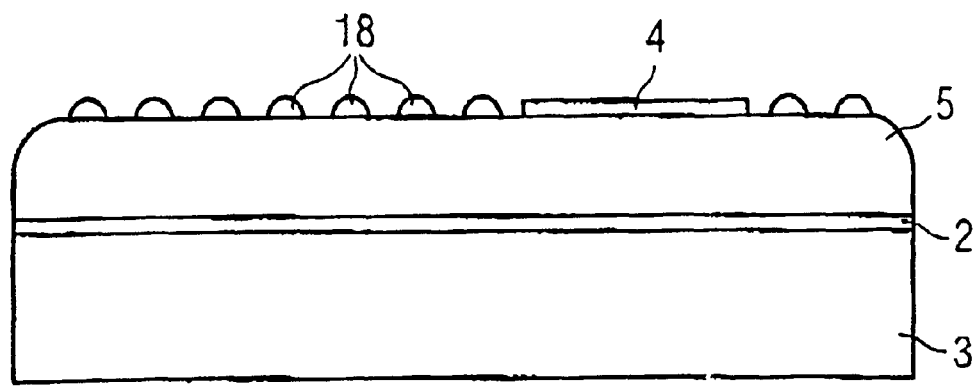

FIG. 2a shows a first method step in the production of another embodiment of a self-adhering chip. The chip 1 in turn comprises a substrate 3 and an insulating layer 2 located on it. The chip 1 is also provided with a polymer layer 5, on which a contact pad 4 is arranged. In this embodiment, the contact pad 4 is consequently located on the polymer layer 5.

In a following method step, the polymer layer 5 is masked by a number of structure elements 18, for example in the form of islands or lines, which consist in particular of filled polymer. These polymers have a higher etching resistance than the polymer layer 5 lying under them.

Figure 2C:
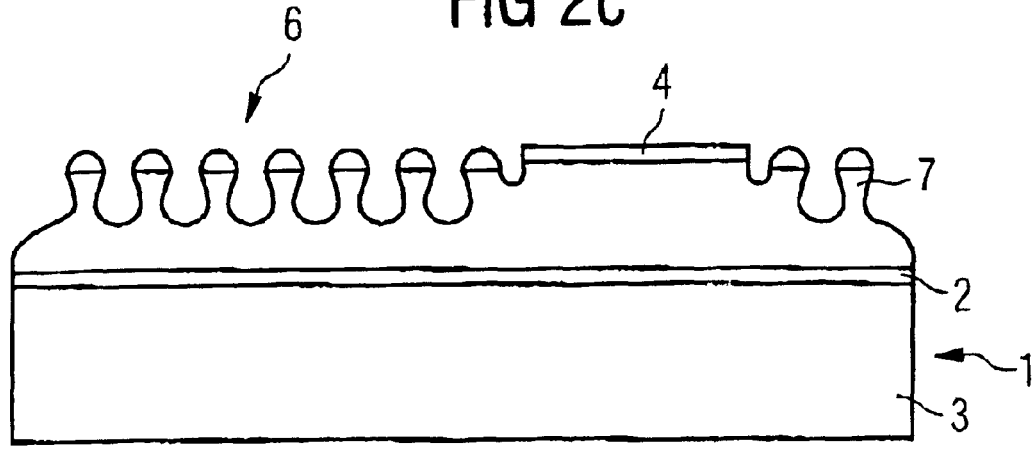

The relief structure remaining after the etching is represented in FIG. 2c. The attachment elements 6 are in turn formed here as a row of extensions 7 and recesses 8.

FIG. 2d shows a contact element 9, that comprise, for example, a conductive polymer, applied to the contact pad 4.

The placement of the chip 1 onto the printed circuit board 20 is represented in FIG. 2e. When the chip 1 and printed circuit board 20 are joined together, the chip is pressed onto the printed circuit board 20 in the direction of the arrow. As shown, the printed circuit board 20 has corresponding attachment elements 16, which engage with the attachment elements 6 of the chip 1.

Figure 2F:
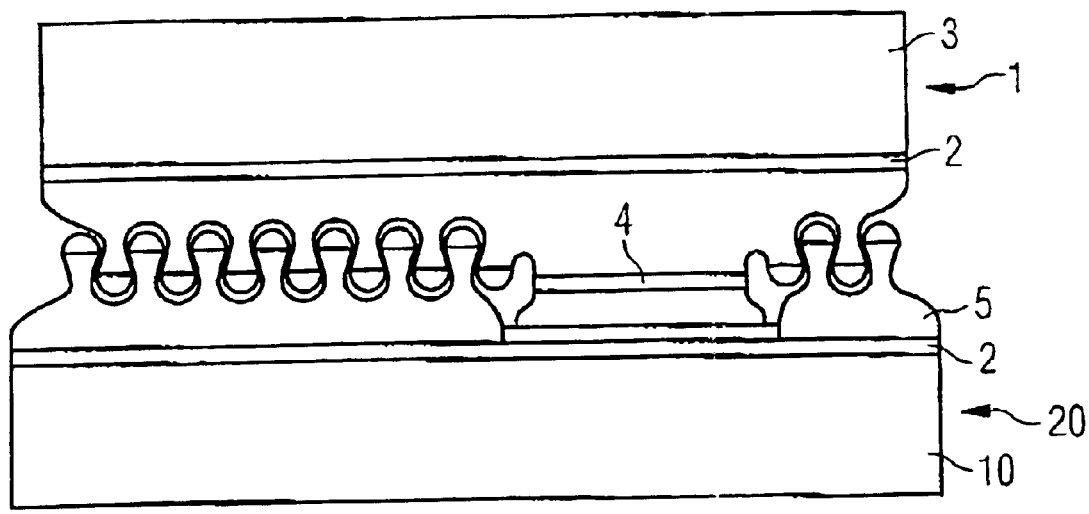

The assembled state of the chip 1 and printed circuit board 20 is represented in FIG. 2f. In this case, the contact element 9 is pressed together and, in this way, ensures a reliable electrical contact with the opposite contact pad 4 of the printed circuit board 20. Optionally, a conductive adhesive may be used in place of the elastic polymer as the contact element 9.

Figure 3A:
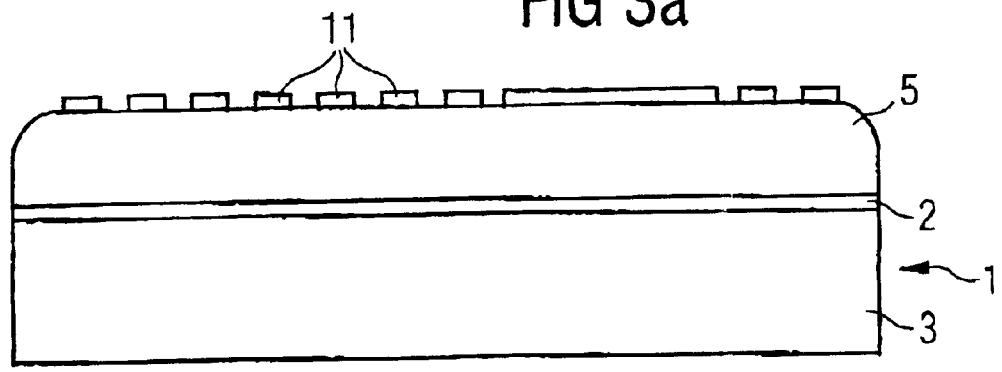
FIGS. 3a, b shows method steps in the production of means of attachment using a metal structure.
Figure 3B:
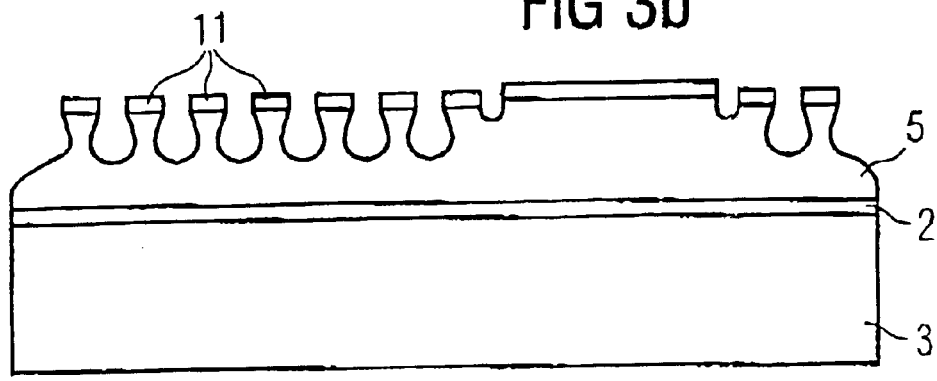

FIGS. 3a and 3b show the production of a relief-like structure as attachment elements, using a metal masking. For this purpose, firstly a metal layer is applied to the polymer layer 5 and is correspondingly structured. The remaining metal structure elements 11 have a relatively high etching resistance, so that, after carrying out an etching process, the structure shown in FIG. 3b can be created.

Another possibility for producing corresponding attachment elements 6, 16 is shown in FIGS. 4a, b. In this case, a specific attachment element: is formed only on one of the mating parts, the chip 1 or the printed circuit board 20. On the other of the mating parts, on the other hand, there is provided a plastically deformable compound, such as for example a not yet cured polymer or a corresponding adhesive. The structure already formed on one of the mating parts is passed onto the other of the mating parts by a kind of transfer process, to be specific by pressing the chip 1 onto the printed circuit board 20. In the example represented, the relief surface of the chip 1 is pressed into the uncured surface of the polymer layer 17 of the printed circuit board 10.

The electrical contact is in this case established by an elastically deformed, conducting contact element 9 or else, for example, by a conductive adhesive.

A further possible way of producing a self-adhering chip arrangement is represented in FIGS. 5a–g. FIG. 5a shows a chip with contact pads 4, on which bump-like contact elements 9 are arranged. The contact elements 9 may be produced, for example, by means of known printing techniques.

In a further method step, which is shown in FIG. 5b, auxiliary forms 12, which serve for producing corresponding attachment elements, are created on the chip 1 and on the carrier 20. The auxiliary forms 12 may, for example, consist of a polymer and be produced by dispensing.

As can be seen in FIG. 5c, in a further method step, hook-shaped attaching elements 13, 14 are applied to the chip 1 and carrier 20. In this case, the respectively interacting attaching elements 13, 14 are easily arranged offset with respect to one another, so that their hook-shaped portions 21, 22 can engage in one another.

After the removal of the auxiliary form 12 on the chip 1 and carrier 20, the arrangement shown in FIG. 5d is obtained. In this case, the contact elements 9 protrude outward beyond the attaching elements 13.

Finally, as shown in FIG. 5e, the chip 1 is pressed onto the carrier 20. In this case, the part 13 of the fastener located on the chip 1 at the same time forms a means of stopping compression when pressure is applied to the elastic contact elements 9.

The assembled state of the chip 1 and carrier 20 is shown in FIG. 5f. In this case, the contacts 9 have been elastically deformed and are under compressive stress, thereby ensuring a good contact junction.

The hook-like portions 21, 22 of the attaching elements 13, 14 are hooked with one another and lock the chip 1 on the carrier 20. The attaching elements 13, 14 form a snap fastener, which is releasable on account of the elasticity of the elements 13, 14, so that the chip 1 is easily removed from the carrier 20.

FIG. 5g shows a three-dimensional view of a self-adhering chip 1 and of the associated carrier 20. The attachment elements 13 of the chip 1 are in this case formed as continuous, elongate attaching elements 13, which can engage in similar attaching elements 14 of the carrier 20.

The attachment elements 13, 14 are preferably arranged on two opposite sides of a chip. A chip preferably comprises two oppositely lying attachment elements, but it is also optionally possible for a number of attaching elements to be provided.

The attachment elements 13 are located on two opposite longitudinal sides of the chip 1. In this case, their hook-like portions 21 point outward. The electrical contact elements 9 are located on the chip 1 within the confines of the contact elements 13. In addition, further attaching elements 13 (of which only one is shown) are provided on the end faces of the chip 1.

Figure 6A:
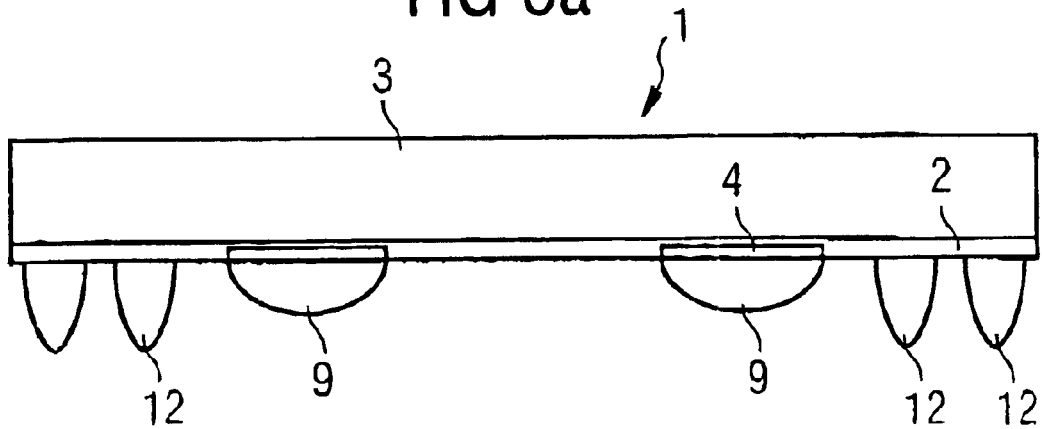
FIGS. 6a–e shows various method steps in the production of a self-adhering chip arrangement according to a fourth embodiment.
Figure 6B:
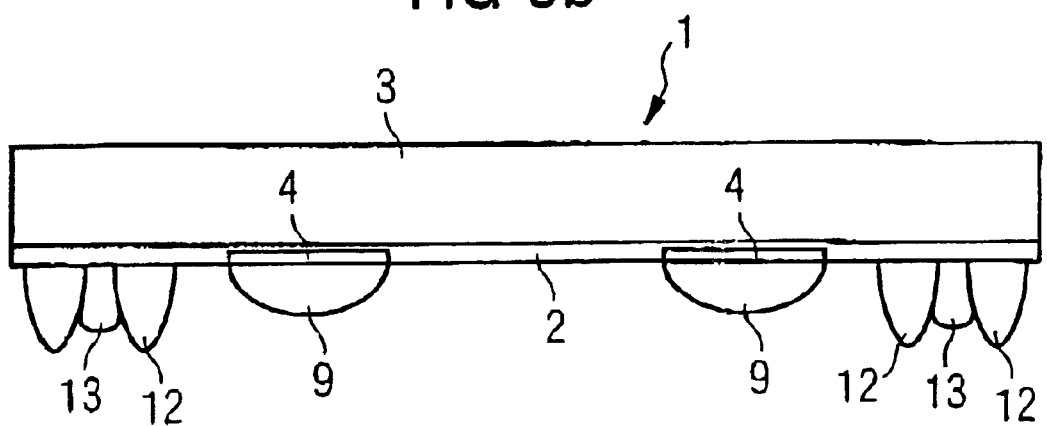

A further embodiment of a self-adhering chip is represented in FIGS. 6a to 6e. For producing the corresponding attaching elements, in FIG. 6a firstly an auxiliary form 12 is created, with which the attaching elements 13 shown in FIG. 6b are produced. The "keys" 13 are produced, for example, by means of dispensing or a suitable printing technique.

Figure 6C:
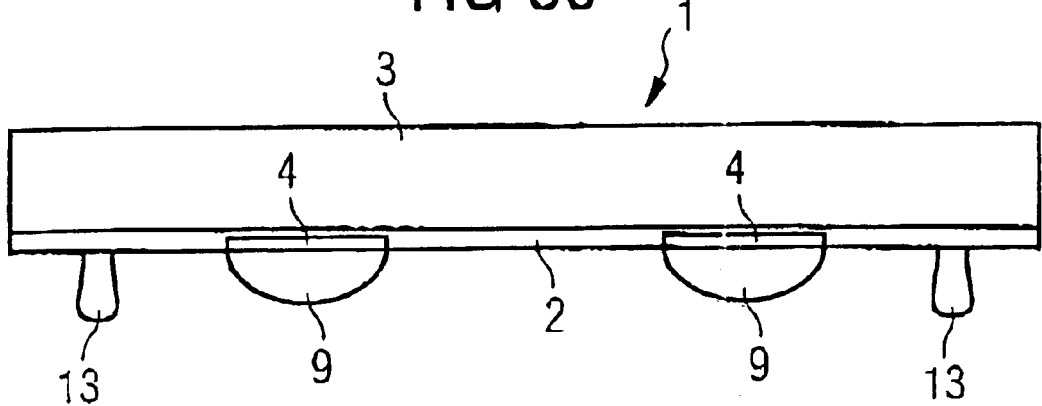

FIG. 6c shows the state of the arrangement after removal of the auxiliary forms 12, which is preferably carried out in a wet-etching process.

Figure 6D:
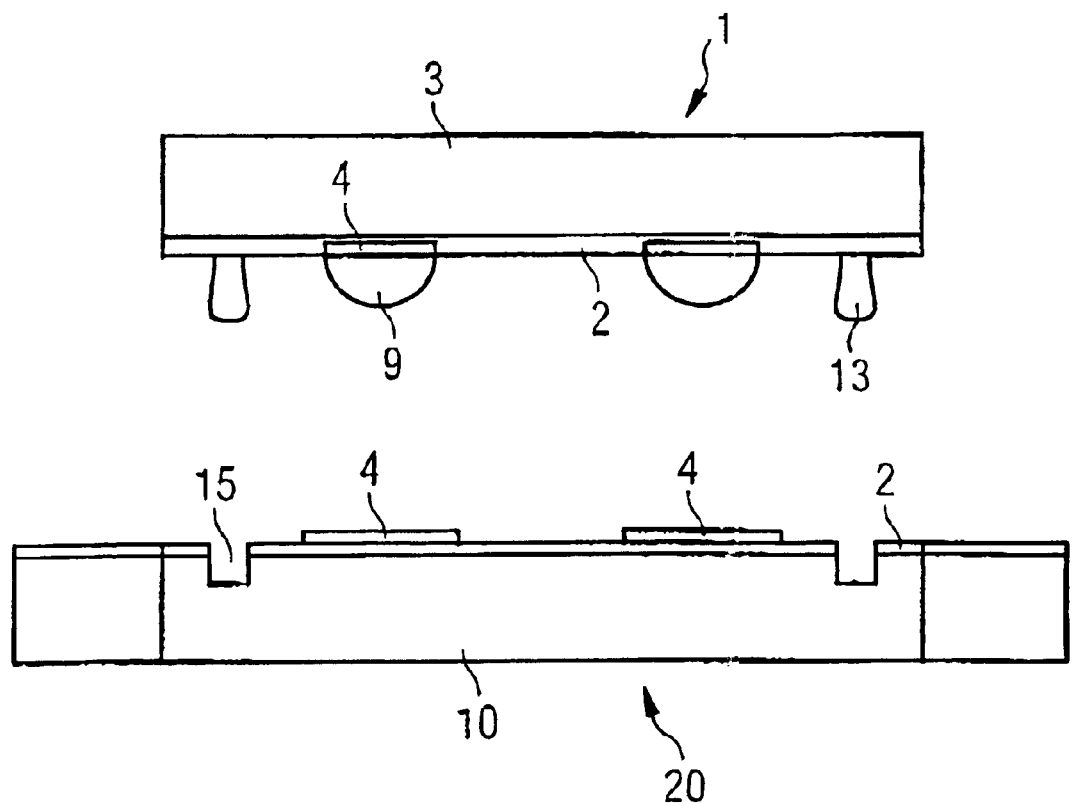

For locking the attaching elements 13, corresponding recesses 15 are provided in the carrier 20 (FIG. 6d). The attaching elements 12 and recesses 15 are in this case arranged such that they lie precisely opposite one another.

In the present case, the contact elements 9 do not extend outward beyond the attaching elements 13 but are located within the extent of the attaching elements 13. However, the thickness of the contact elements 9, viewed perpendicularly in relation to the surface of the chip, is greater than the distance between the surfaces of the chip 1 and carrier 20 in the assembled state. This ensures a good electrical contact, since the contact element is deformed when the chip and carrier are joined together.

Figure 6E:
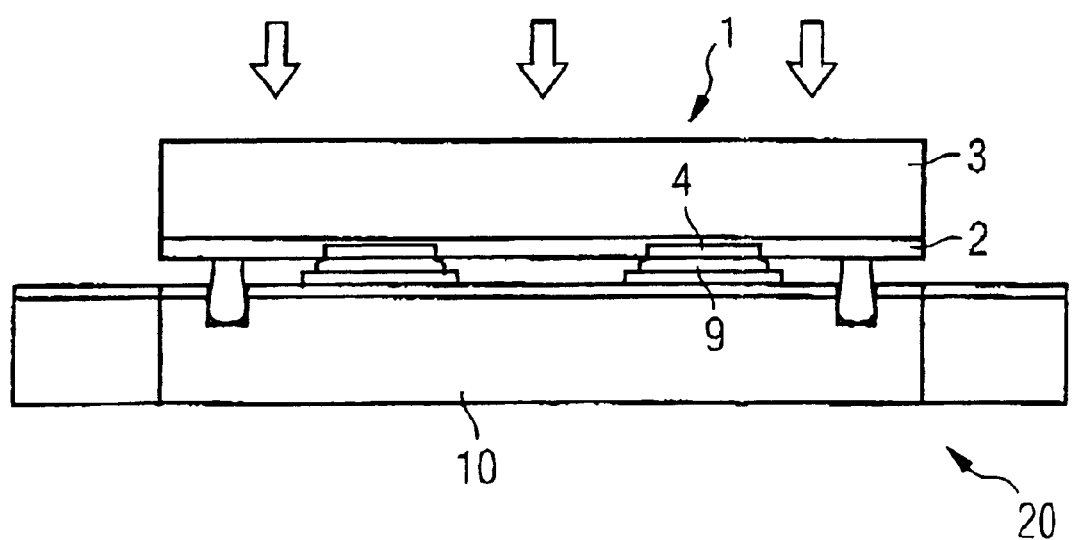

FIG. 6e shows the assembled state of the chip 1 and carrier 20. In this case, the attaching elements 13 protrude into corresponding recesses 15 of the carrier and lock the chip 1 in this position.

Figure 7A:
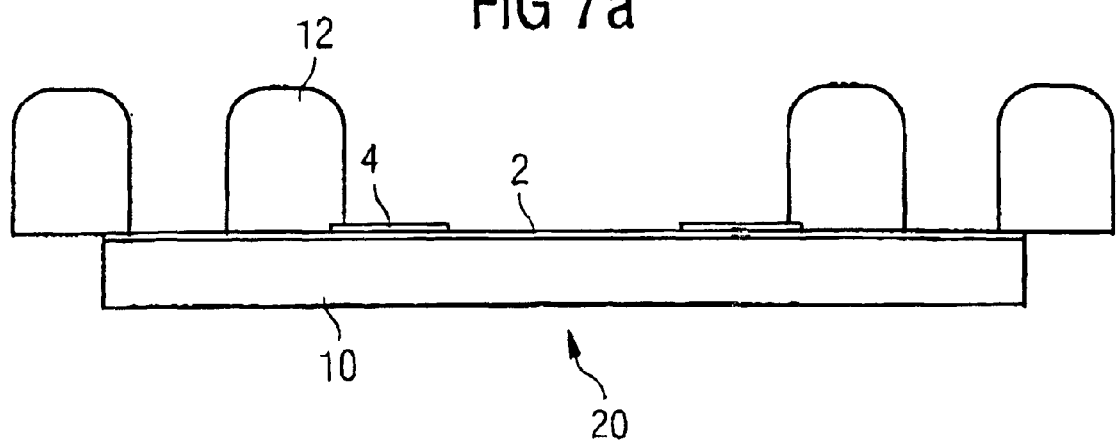
FIGS. 7a–e show various method steps in the production of a self-adhering chip arrangement according to a fifth embodiment.

The production of a further embodiment of a self-adhering chip is represented in FIGS. 7a–e. FIG. 7a firstly shows the production of an auxiliary form 12, for example from a specific polymer compound, which partially covers the contact areas 4.

Figure 7B:
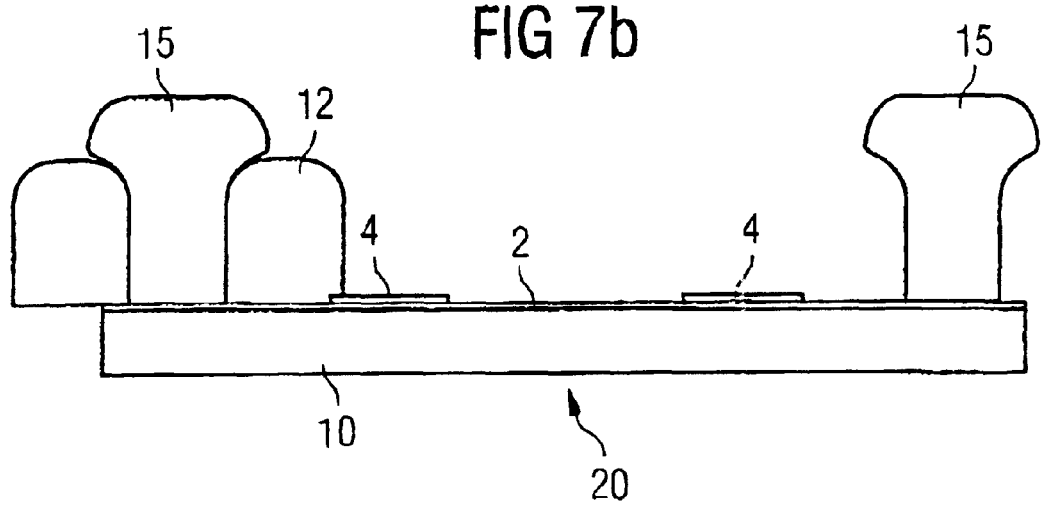

In a further method step, as shown in FIG. 7b, hook-like attaching elements 15 are created between two oppositely lying auxiliary forms 12. The production of the hook structures takes place, for example, by means of dispensing and a suitable printing technique.

Figure 7C:
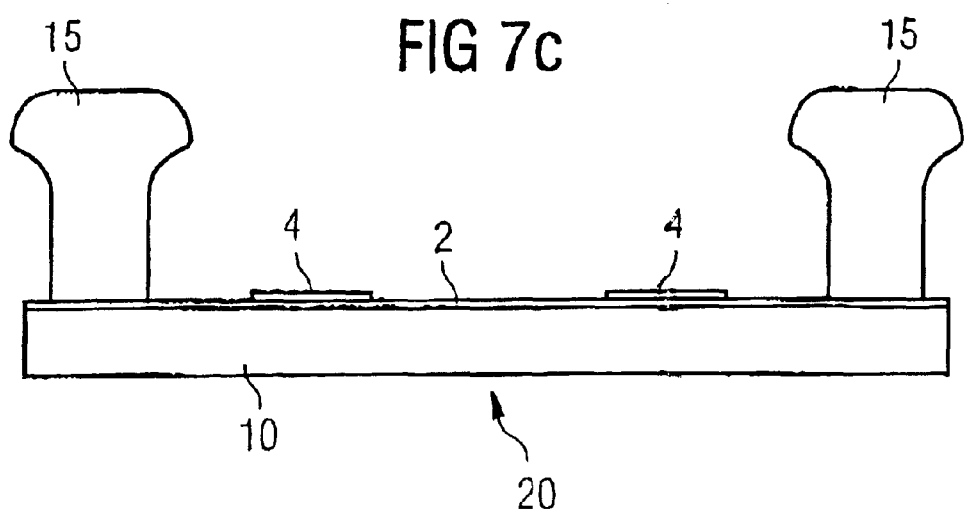

FIG. 7c shows the state of the carrier 20 after the removal of the auxiliary forms 12 by wet etching.

Figure 7D:
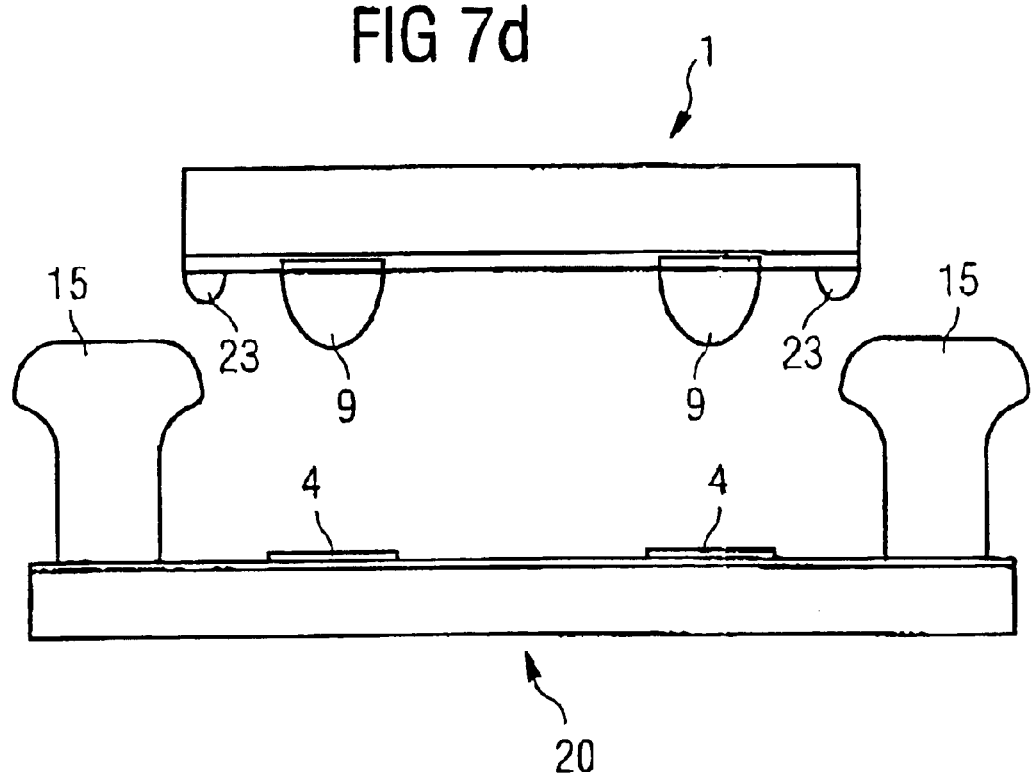

In FIG. 7d, the chip 1 has been positioned over the carrier, the chip 1 having on its lower outer edges protector elements 23, which on the one hand make it easier for the chip to be pressed onto the carrier (they provide a certain guidance) and on the other hand protect the attachment elements 15 from the sharp-edged sides of the chip 1. The elements 23 may likewise be produced from polymer.

Figure 7E:
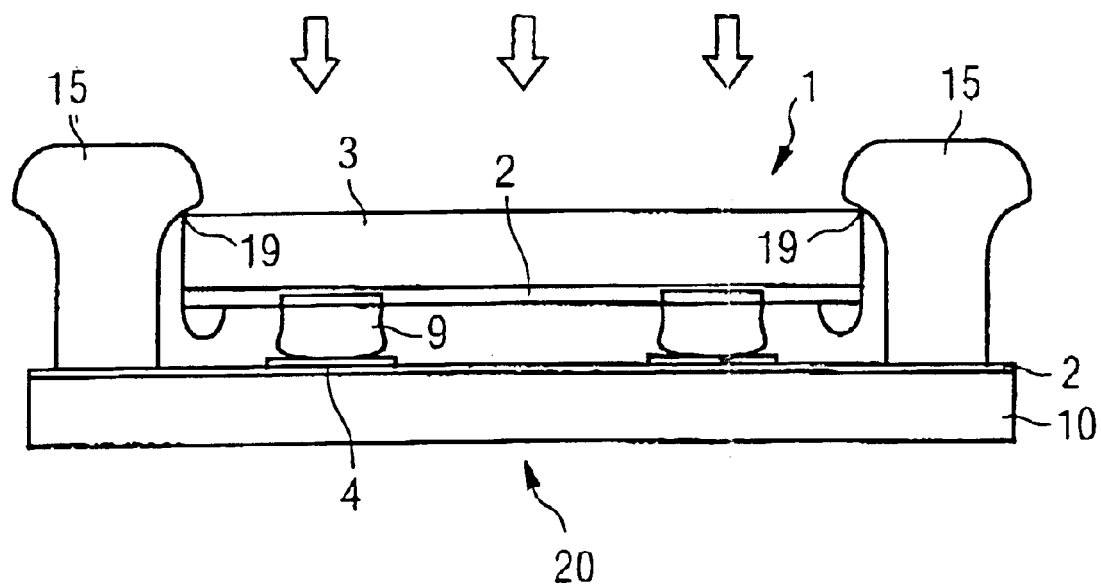

FIG. 7e shows the chip 1 in the placed-on state. In this case, it can be seen that the chip has no separate attachment elements in the region between the chip 1 and the carrier 20. Rather, the upper edges 19 of the chip 1 itself serve for locking with the hook portions 22 of the attaching elements 15. In this embodiment of the self-adhering chip, there is in particular no need for method steps for producing separate holding elements.

While preferred embodiments have been illustrated and described in detail in the drawings and foregoing description, the same is to be considered as illustrative and not restrictive in character, it being understood that only the preferred embodiments have been shown and described and that all changes and modifications that come within the spirit of the invention both now or in the future are desired to be protected.

We claim as our invention:

1. An integrated circuit chip assembly, comprising:
    a carrier having above a surface thereof a layer comprising a compound which in a first state is plastically deformable and in a second state is hardened, said layer having an opening in which is positioned a contact pad;
    a chip having a layer with a plurality of extensions which are sufficiently rigid to project into said compound when said compound is plastically deformable and when the layer with the extensions is pushed into the compound, a portion of said chip layer having a contact pad and a conducting contact which has at least one state in which it is elastically deformable so that when the chip and carrier are mated, the elastically deformable conducting contact deforms to provide electrical contact between the chip contact pad and the carrier contact pad.

2. The chip assembly of claim 1 wherein the carrier layer compound comprises a polymer which in said first state is not yet cured and in said second state is cured.

3. The chip assembly of claim 1 wherein said chip layer compound comprises an adhesive which is plastically deformable in said first state.

4. The chip assembly of claim 1 wherein said extensions comprise finger-like protrusions with gaps therebetween.

5. The chip assembly of claim 1 wherein said conducting contact of said chip comprises in a first state an elastically deformable conducting contact element prior to mating of the chip and carrier, and which in a second state is hardened after the chip and carrier have been mated.

6. The chip assembly according to claim 1 wherein said conducting contact of the chip comprises a conductive adhesive.

7. The chip assembly of claim 1 wherein said chip comprises a substrate with an insulating layer at a surface thereof, and said layer with said extensions on said insulating layer.

8. The chip assembly according to claim 1 wherein said carrier comprises a printed circuit board having an insulating layer at a surface thereof and on said insulating layer said plastically deformable compound layer.

9. The chip assembly according to claim 1 wherein said carrier comprises a printed circuit board.

10. An integrated circuit chip assembly, comprising:
a carrier having above a surface thereof a layer comprising a compound which in a first state is plastically deformable and in a second state is hardened, said layer having an opening in which is positioned a contact pad;
a chip having a layer with a plurality of extensions which are sufficiently rigid to project into said compound when said compound is plastically deformable and when the layer with the extensions is pushed into the compound, a portion of said chip layer having a contact pad.

11. A method for attaching a chip to a carrier, comprising the steps of:
providing the carrier with a plastically deformable compound layer and in an opening of the compound layer providing a contact pad;
providing the chip with a layer having a plurality of extensions and a contact pad, and with an elastically deformable conducting contact on the contact pad; and
pressing the chip and the carrier together so that the extensions are pressed into the plastically deformable compound layer and the elastically deformable conducting contact is deformed between the chip contact pad and the carrier contact pad.

12. The method according to claim 11 wherein said chip plastically deformable compound layer comprises a not yet cured polymer, and
after the pressing together the polymer is cured.

13. The method according to claim 11 wherein the plastically deformable compound comprises an adhesive.

14. The method according to claim 11 wherein the elastically deformable connecting contact comprises a contact element.

15. The method according to claim 11 wherein the elastically deformable connecting contact comprises a conductive adhesive.

16. The method according to claim 11 wherein the chip comprises a substrate having an insulating layer at a surface thereof and said layer with the extensions lie on the insulating layer.

17. The method according to claim 11 wherein the carrier comprises a printed circuit board having an insulating layer thereon and said plastically deformable compound lies on said insulating layer.

18. The method according to claim 11 wherein the carrier comprises a printed circuit board.

19. A method for attaching a chip to a carrier, comprising the steps of:
providing the carrier with a plastically deformable compound layer and in an opening of the compound layer providing a contact pad;
providing the chip with a layer having a plurality of extensions and a contact pad; and
pressing the chip and the carrier together so that the extensions are pressed into the plastically deformable compound layer and the elastically deformable conducting contact is deformed between the chip contact pad and the carrier contact pad.

* * * * *